(12) United States Patent
Takahashi

(10) Patent No.: US 9,204,114 B2
(45) Date of Patent: Dec. 1, 2015

(54) IMAGING ELEMENT AND IMAGING APPARATUS

(71) Applicant: FUJIFILM Corporation, Tokyo (JP)

(72) Inventor: Shu Takahashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/498,558

(22) Filed: Sep. 26, 2014

(65) Prior Publication Data

US 2015/0009373 A1 Jan. 8, 2015

Related U.S. Application Data

(63) Continuation of application No. PCT/JP2013/051283, filed on Jan. 23, 2013.

(30) Foreign Application Priority Data

Mar. 28, 2012 (JP) ................................. 2012-074309

(51) Int. Cl.
*H04N 5/369* (2011.01)
*H04N 9/77* (2006.01)
(Continued)

(52) U.S. Cl.
CPC .......... *H04N 9/045* (2013.01); *H01L 27/14605* (2013.01); *H01L 27/14621* (2013.01); *H01L 27/14623* (2013.01); *H01L 27/14627* (2013.01); *H04N 5/3696* (2013.01); *H04N 9/77* (2013.01);
(Continued)

(58) Field of Classification Search
CPC ....... H04N 5/3696; H04N 9/045; H04N 9/77; H04N 13/0257; H04N 5/23212; H01L 27/14627; H01L 27/14605; H01L 27/14621; H01L 27/14623

USPC .......... 348/272, 294, 46, 49, 208.11, 333.08, 348/335
See application file for complete search history.

(56) References Cited

U.S. PATENT DOCUMENTS 7,470,965 B2 * 12/2008 Kuriyama ..................... 257/443
8,748,799 B2 *  6/2014 Wober ....................... 250/214.1
(Continued)

FOREIGN PATENT DOCUMENTS

JP  2007-281296 A  10/2007
JP  2009-89144 A   4/2009
(Continued)

OTHER PUBLICATIONS

International Search Report for PCT/JP2013/051283 mailed on Mar. 5, 2013.
(Continued)

*Primary Examiner* — Hung Lam
(74) *Attorney, Agent, or Firm* — Birch, Stewart, Kolasch & Birch, LLP

(57) ABSTRACT

A solid-state imaging element includes pixel cells in which apertures of light shielding films are off-centered in opposite directions. The pixel cells includes a pixel cell which detects a R light component, a pixel cell which detects a G light component, and a pixel cell which detects a B light component. In the pixel cells, a relationship among an off-centered amount Or of the aperture in the pixel cell which detects the R light component, an off-centered amount Og of the aperture in the pixel cell which detects the G light component, and an off-centered amount Ob of the aperture in the pixel cell which detects the B light component is Or>Og>Ob.

11 Claims, 11 Drawing Sheets

(51) Int. Cl.
*H04N 9/04* (2006.01)
*H01L 27/146* (2006.01)
*H04N 13/02* (2006.01)
*H04N 5/232* (2006.01)

(52) U.S. Cl.
CPC ........ *H04N 13/0257* (2013.01); *H04N 5/23212* (2013.01)

(56) References Cited

U.S. PATENT DOCUMENTS

| | | | | |
|---|---|---|---|---|
| 2006/0138313 | A1* | 6/2006 | Tennant et al. | 250/226 |
| 2009/0067055 | A1* | 3/2009 | Yamamura | 359/622 |
| 2010/0033829 | A1* | 2/2010 | Wippermann et al. | 359/623 |
| 2010/0053414 | A1* | 3/2010 | Tamaki et al. | 348/340 |
| 2010/0188532 | A1* | 7/2010 | Kusaka et al. | 348/240.99 |

FOREIGN PATENT DOCUMENTS

| | | |
|---|---|---|
| JP | 2010-93757 A | 4/2010 |
| JP | 2010-243772 A | 10/2010 |

OTHER PUBLICATIONS

Written Opinion of the International Searching Authority for PCT/JP2013/051283 mailed on Mar. 5, 2013.

* cited by examiner

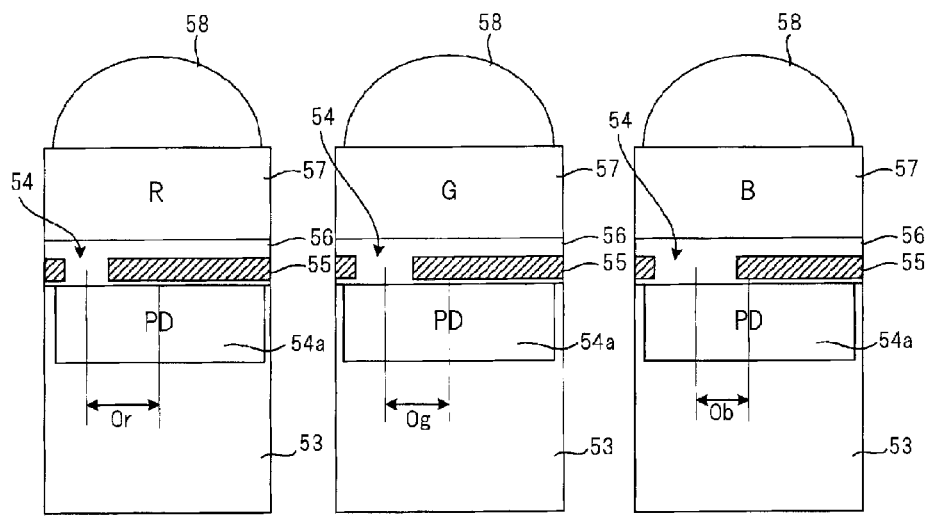
*FIG. 4A*  *FIG. 4B*  *FIG. 4C*
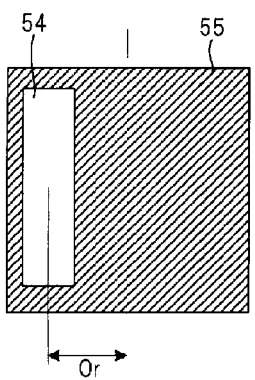 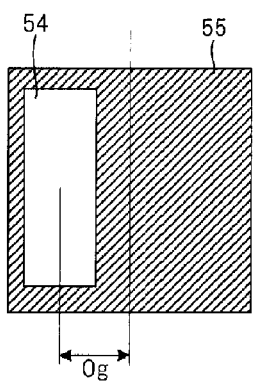 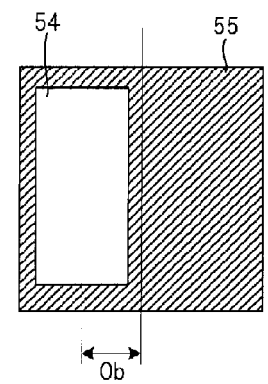
*FIG. 5A*  *FIG. 5B*  *FIG. 5C*

*FIG. 6A* *FIG. 6B* *FIG. 6C*
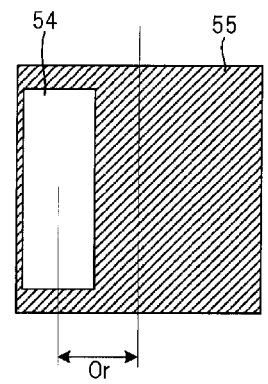 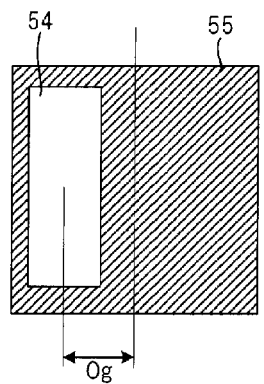 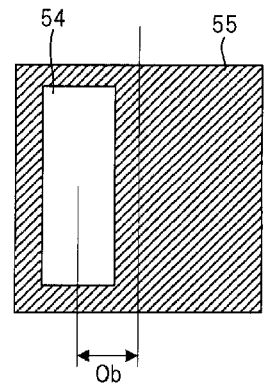
*FIG. 7A* *FIG. 7B* *FIG. 7C*
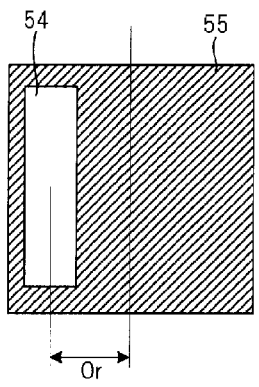 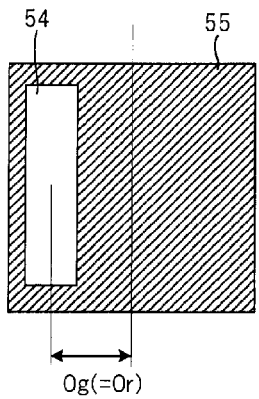 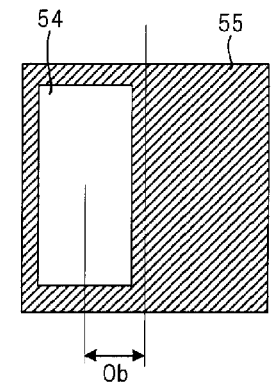

FIG. 8A    FIG. 8B    FIG. 8C
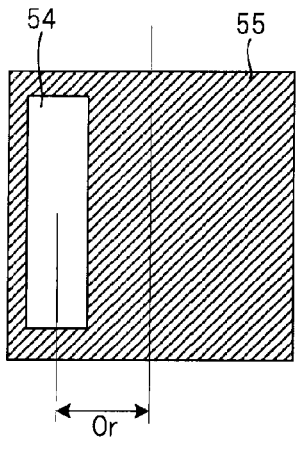
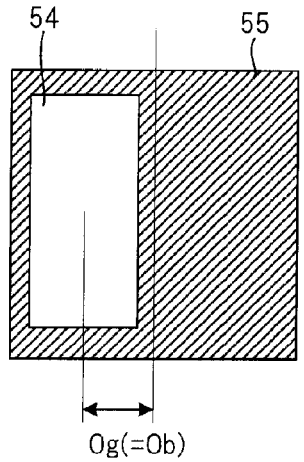
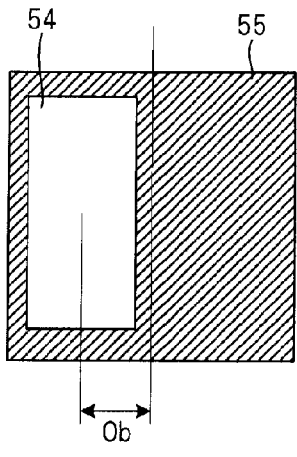
FIG. 9
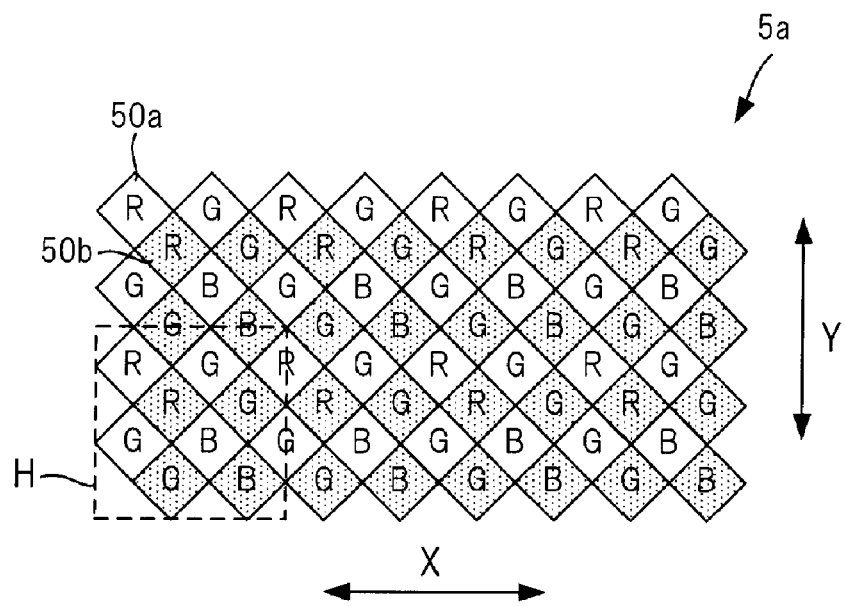

IMAGING ELEMENT AND IMAGING APPARATUS

CROSS REFERENCE TO RELATED APPLICATION

This is a continuation of International Application No. PCT/JP2013/051283 filed on Jan. 23, 2013, and claims priority from Japanese Patent Application No. 2012-074309, filed on Mar. 28, 2012, the entire disclosures of which are incorporated herein by reference.

TECHNICAL FIELD

The present invention relates to an imaging element and an imaging apparatus including the same.

BACKGROUND ART

Recently, as the resolution of a solid state imaging element such as a charge coupled device (CCD) image sensor, and a complementary metal oxide semiconductor (CMOS) image sensor becomes higher, a demand for an information device having an imaging function such as a digital still camera, a digital video camera, a cellular phone, and a personal digital assistant (PDA) is rapidly increasing. The information device having an imaging function as described above is referred to as an imaging apparatus.

A focusing control method which detects a distance to a main subject to focus on the subject include a contrast auto focus (AF) method and a phase difference AF method. Since the phase difference AF method may detect a focusing position with a high precision at a high speed as compared with the contrast AF method, the phase difference AF method is widely employed in various imaging apparatuses (see, e.g., Patent Literature 1).

Patent Literature 1 discloses an imaging element in which some of R pixel cells which detect a red light component, some of G pixel cells which detect a green light component, and some of B pixel cells which detect a blue light are used as focus detecting pixel cells of a photographing optical system.

CITATION LIST

Patent Literature

Patent Literature 1: JP-A-2010-243772

SUMMARY OF INVENTION

Technical Problem

Due to the progress of miniaturization, a recent imaging element is configured such that the size of a spot light condensed on an optical aperture of each pixel cell largely varies depending on a wavelength of light which is detected by the pixel cell.

When plural type of pixel cells which detect different colors of lights are used as focus detecting pixel cells as disclosed in Patent Literature 1, among the plural types of focus detecting pixel cells, a pixel cell detecting a light having a longer wavelength has a wider extension range of light condensed on a surface of a semiconductor (size of a spot light) by a micro lens of the focusing detecting pixel cell.

In a focus detecting pixel cell, for example, an aperture of a light shielding film which shields a photoelectric converting unit is configured by a pair of two pixel cells which are off-centered in opposite directions with respect to a center of the micro lens at an upper side (a light entrance side) of the photoelectric converting unit.

In the focus detecting pixel cells with this configuration, a phase difference of a signal detected by a pair of pixel cells is reduced as the spot lights of the pixel cells increase.

Therefore, a variation is caused in precision of obtaining phase difference information (a deviated amount of images which respectively correspond to a pair of luminous fluxes which have passed through different pupil areas of a photographing optical system) depending on the type of focus detecting pixel cell such that the phase difference AF may not be precisely performed.

In addition, when the focus detecting pixel cells are used to create a captured image, a phase difference varies depending on a color detected by the pixel cell, and as a result, unnatural coloration is generated on the captured image, which results in deteriorated imaging quality.

The present invention has been made in consideration of the situations described above and an object of the present invention is to provide an imaging element which is capable of precisely detecting a deviated amount of images which respectively correspond to a pair of luminous fluxes which have passed through different pupil areas of a photographing optical system so that an imaging quality can be improved, and an imaging apparatus including the same.

Solution to Problem

The present invention includes an imaging element capable of outputting a pair of image signals which correspond to a pair of luminous fluxes which pass through different pupil areas of a photographing optical system, respectively, the imaging element including: pixel cells including photoelectric converting units, micro lenses provided at light entrance sides of the photoelectric converting units to condense lights onto the photoelectric converting units and light shielding films which is provided between the photoelectric converting units and the micro lenses and has apertures at the light entrance sides of the photoelectric converting units, in which the pixel cells include plural sets of pairs each having a first pixel cell and a second pixel cell, center positions of apertures of light shielding films of the first pixel cell and the second pixel cell being off-centered in opposite directions with respect to an optical axis of the micro lens, the first pixel cell and the second pixel cell are divided into plural types which detect lights of different wavelength bands, respectively, and among the pixel cells, a distance from an optical axis of the micro lens to the center of the aperture of the micro lens for each of the first pixel cell and the second pixel cell in which a wavelength band of the light detected by the photoelectric converting unit becomes the longest wavelength side is longer than the distance for each of the first pixel cell and the second pixel cell in which a wavelength band of the light becomes the shortest wavelength side.

The present invention includes an imaging apparatus including: the imaging element.

The imaging apparatus of the present invention is provided with the above-described imaging element.

Advantageous Effects of Invention

According to the present invention, a deviated amount of images which respectively correspond to a pair of luminous fluxes which have passed through different pupil areas of a photographing optical system may be precisely detected. As a result, the precision of a phase difference AF may be improved and unnatural coloration may be prevented from being generated on the captured image, thereby improving the imaging quality.

BRIEF DESCRIPTION OF DRAWINGS

FIGS. 4A to 4C are schematic cross-sectional views of an R pixel cell 50b, a G pixel cell 50b, and a B pixel cell 50b in the solid-state imaging element 5 illustrated in FIGS. 2 and 3.

FIGS. 5A to 5C are plan views for each pixel cell 50a illustrated in FIGS. 4A to 4C, as viewed from a micro lens 58 side.

FIGS. 6A to 6C are views for illustrating a modified embodiment of an opening shape of a light shielding film in each pixel cell 50 of the solid-state imaging element 5 illustrated in FIG. 1.

FIGS. 7A to 7C are views for illustrating a modified embodiment of an opening shape of a light shielding film in each pixel cell 50 of the solid-state imaging element 5 illustrated in FIG. 1.

FIGS. 8A to 8C are views for illustrating a modified embodiment of an opening shape of a light shielding film in each pixel cell 50 of the solid-state imaging element 5 illustrated in FIG. 1.

FIG. 9 is a schematic plan view of a solid-state imaging element 5a which is a modified embodiment of the solid-state imaging element 5 illustrated in FIG. 2.

DESCRIPTION OF EMBODIMENTS

Hereinafter, an embodiment of the present invention will be described with reference to the drawings.

Figure 1:
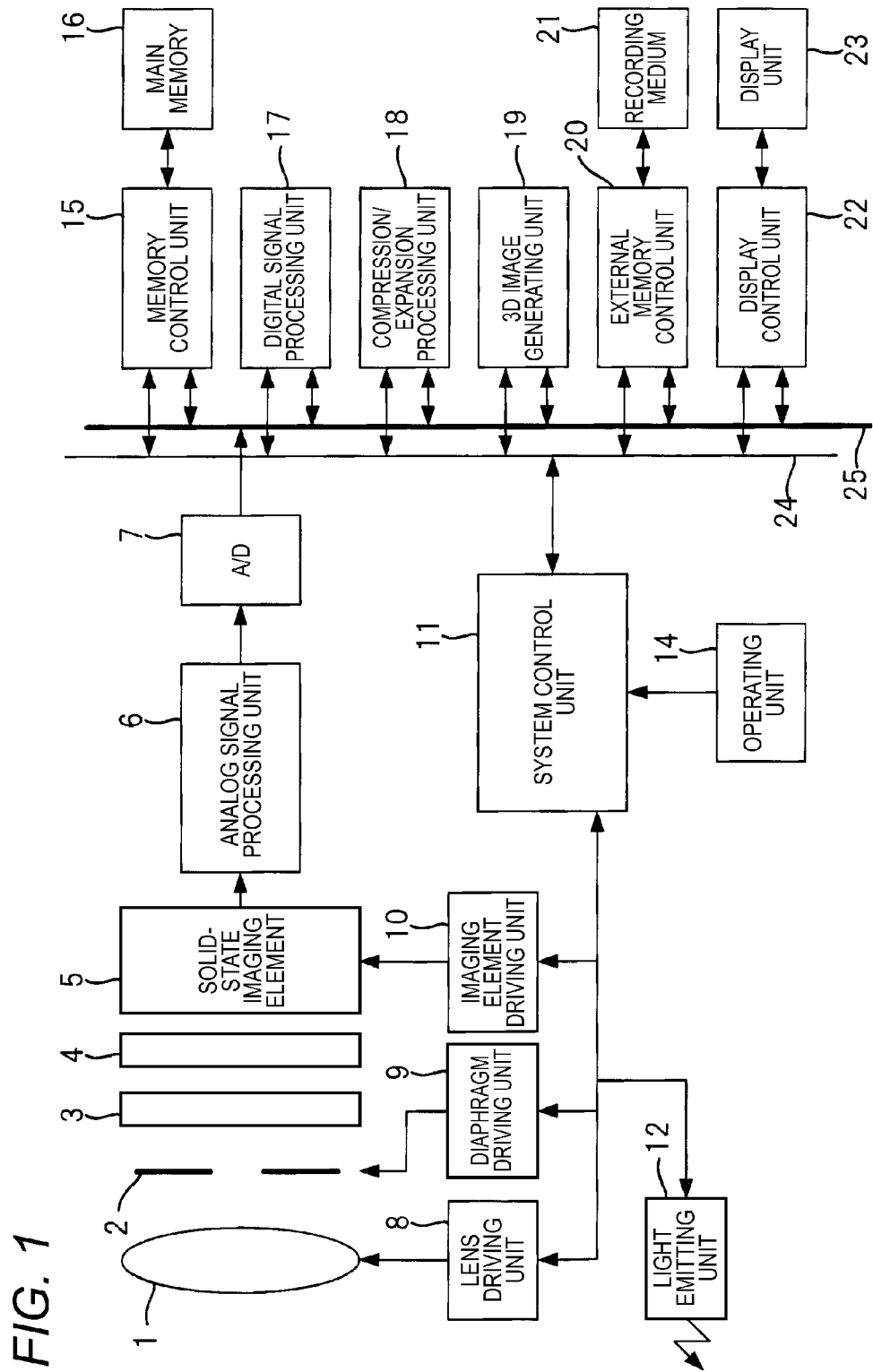
FIG. 1 is a view illustrating a schematic configuration of a digital camera as an example of an imaging apparatus according to an embodiment of the present invention.

FIG. 1 is a view illustrating a schematic configuration of a digital camera as an example of an imaging apparatus to explain an embodiment of the present invention.

An imaging system of the illustrated digital camera includes a single photographing optical system 1 which includes a focus lens and a zoom lens, a solid-state imaging element 5 such as a CCD image sensor or a CMOS image sensor, a diaphragm 2 which is provided between the photographing optical system 1 and the solid-state imaging element 5, an infrared cut filter 3, and an optical low-pass filter 4.

A system control unit 11 which controls an entire electrical control system of the digital camera controls a flash light emitting unit 12. Also, the system control unit 11 controls a lens driving unit 8 so as to perform focusing adjustment by moving a position of a focus lens included in the photographing optical system 1 towards the optical axis direction and image magnification adjustment by moving the position of a zoom lens which is included in the photographing optical system towards the optical axis direction. Furthermore, the system control unit 11 controls an aperture size of the diaphragm 2 through a diaphragm driving unit 9 so as to adjust an exposure amount.

In addition, the system control unit 11 drives the solid state imaging element 5 through an imaging element driving unit 10 and outputs a subject image captured through the photographing optical system 1 as a captured image signal. An instruction signal from a user is input to the system control unit 11 through an operating unit 14.

The electrical control system of the digital camera further includes an analog signal processing unit 6 connected to an output of the solid-state imaging element 5 to perform an analog signal processing such as a correlated double sampling processing, and an A/D converting circuit 7 which converts an RGB color signal output from the analog signal processing unit 6 into a digital signal. The analog signal processing unit 6 and the A/D converting circuit 7 are controlled by the system control unit 11. Also, the color signal may be a color difference signal.

Furthermore, the electrical control system of the digital camera includes a main memory 16, a memory control unit 15 which is connected to the main memory 16, a digital signal processing unit 17, an compression/expansion processing unit 18, a 3D image generating unit 19, an external memory control unit 20 to which a detachable recording medium 21 is connected, and a display control unit 22 to which a liquid crystal display unit 23 mounted on a rear surface of the camera is connected.

The digital signal processing unit 17 performs an interpolation operation, a gamma correction operation, and an RGB/YC conversion processing on a captured image signal output from the A/D converting circuit 7 so as to generate captured image data.

The compression/expansion processing unit 18 compresses the captured image data generated in the digital signal processing unit 17 in a JPEG format or expands the compressed image data.

The 3D image generating unit 19 generates stereoscopic image data using a plurality of captured image data (a plurality of captured image data having parallax) having different points of view which is captured by the solid-state imaging element 5.

The liquid crystal display unit 23 may display two captured image data having parallax to be stereoscopically viewed.

The memory control unit 15, the digital signal processing unit 17, the compression/expansion processing unit 18, the 3D image generating unit 19, the external memory control unit 20, and the display control unit 22 are connected to each other by a control bus 24 and a data bus 25 to be controlled in accordance with a command from the system control unit 11.

Figure 2:
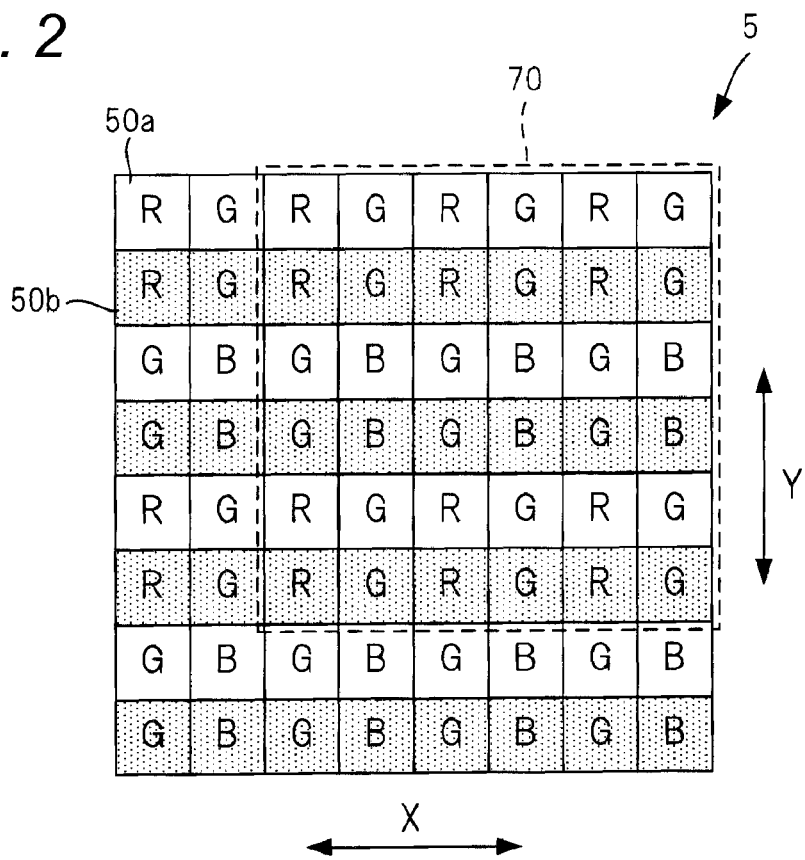
FIG. 2 is a schematic plan view illustrating a schematic configuration of a solid-state imaging element 5 illustrated in FIG. 1.

FIG. 2 is a schematic plan view illustrating a schematic configuration of a solid-state imaging element 5 illustrated in FIG. 1.

The solid-state imaging element 5 includes a pixel cell 50a configured to obtain one of a pair of image signals which respectively correspond to a pair of luminous fluxes which pass through different pupil areas of the photographing optical system 1, and a pixel cell 50b configured to obtain the other of the pair of image signals. Hereinafter, when the pixel cell 50a and the pixel cell 50b are not distinguished, the pixel cell 50a and the pixel cell 50b are referred to as pixel cells 50.

The pixel cells 50 are two-dimensionally (a square lattice shape in an example of FIG. 2) arranged in a row direction X and a column direction Y which is perpendicular to the row direction X. Each pixel cell 50 includes a photoelectric converting unit such as a photodiode.

The arrangement of the pixel cells 50 are configured such that a plurality of pixel cell rows including a plurality of pixel cells 50, which is lined up in a row direction X at a predetermined pitch, is lined up in a column direction Y at a predetermined pitch.

In this arrangement, the pixel cell rows in odd-numbered rows are configured by the pixel cells 50a and the pixel cell rows in even-numbered rows are configured by the pixel cells 50b.

The pixel cells 50a and the pixel cells 50b receive luminous fluxes which pass through different pupil areas of the photographing optical system 1. In other words, one of the pair of image signals is obtained by the pixel cells 50a in the odd-numbered rows and the other one of the pair of image signals is obtained by the pixel cells 50b in the even-numbered rows.

The pixel cells 50a include three types of pixel cells, that is, a pixel cell (referred to as an R pixel cell 50a) which detects light (R light component) in a red wavelength band, a pixel cell (referred to as a G pixel cell 50a) which detects light (G light component) in a green wavelength band, and a pixel cell (referred to as a B pixel cell 50a) which detects light (B light component) in a blue wavelength band.

The pixel cells 50b include three types of pixel cells, that is, a pixel cell (referred to as an R pixel cell 50b) which detects a R light component, a pixel cell (referred to as a G pixel cell 50b) which detects a G light component, and a pixel cell (referred to as an B pixel cell 50b) which detects a B light component.

In FIG. 2, a reference character "R" is denoted in the blocks of the R pixel cells 50a and the R pixel cells 50b. In addition, a reference character "G" is denoted in blocks of the G pixel cells 50a and the G pixel cells 50b. Furthermore, a reference character "B" is denoted in blocks of the B pixel cells 50a and the B pixel cells 50b.

As illustrated in FIG. 2, lines of detecting colors of the pixel cells 50a in the odd-numbered rows have a Bayer pattern.

Next to each pixel cell 50a in the same direction (the column direction Y), the same type of pixel cell 50b as the pixel cell 50a is disposed. That is, the lines of the detecting colors of the pixel cells 50b in the even-numbered rows also have a Bayer pattern.

A pixel cell pair is configured by the same type of pixel cells 50a and 50b which are adjacent to each other in the column direction Y. It may be said that the solid-state imaging element 5 is formed by arranging pixel cell pairs in a square lattice form.

Figure 3:
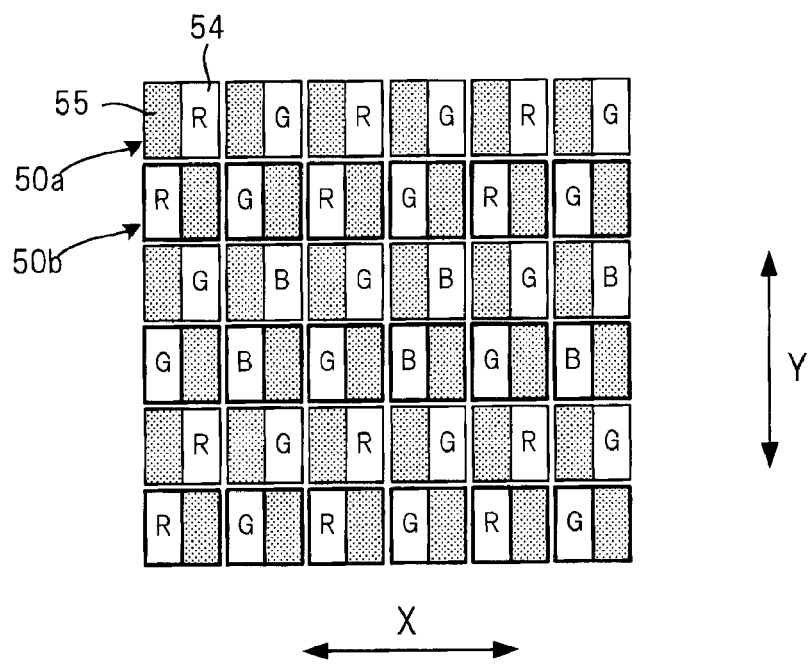
FIG. 3 is a schematic plan view illustrating, in an enlarged scale, a portion 70 enclosed by a dotted line in the solid-state imaging element 5 illustrated in FIG. 2.

FIG. 3 is a schematic view illustrating, in detail, a portion 70 enclosed by a dotted line in the solid-state imaging element 5 illustrated in FIG. 2.

In each pixel cell 50, a region in which a reference character "R", "G", or "B" is denoted at the center thereof is an aperture 54 which is formed in the light shielding film 55 to receive light and a hatched region is a light-shielded region by a light shielding film 55.

In the pixel cell 50a, the aperture 54 is off-centered to the right side in the row direction X. In addition, in the pixel cell 50b, the aperture 54 is off-centered to the left side in the row direction X.

As described above, in the pixel cells 50a and the pixel cells 50b which configure pair pixel cells, the apertures 54 are twisted in opposite directions in the row direction X.

As a result, when a subject is captured using the solid-state imaging element 5, a first captured image signal obtained by the pixel cells 50a is considered as a subject which is watched by a left eye and a second captured image signal obtained by the pixel cells 50b is considered as a subject which is watched by a right eye so that there may be a deviation (phase difference or parallax) between both captured image signals.

Accordingly, the first captured image signal and the second captured image signal are considered as left and right captured image signals so that a stereographic image may be captured using a single photographing optical system and a single imaging element.

The 3D image generating unit 19 of FIG. 1 generates captured image data for a left eye from the first captured image signal which is output from the solid-state imaging element 5 and generates captured image data for a right eye from the second captured image signal which is output from the solid-state imaging element 5 and associates the captured image data with each other to generate stereographic image data.

The system control unit 11 of FIG. 1 performs a phase difference AF control to that adjust a focus of the photographing optical system 1, based on a phase difference between the first captured image signal and the second captured image signal which are output from the solid-state imaging element 5.

The digital signal processing unit 17 of FIG. 1 adds captured image signals obtained from the pixel cell pairs, among the first captured image signals and the second captured image signals which are output from the solid-state imaging device 5. By doing this, a captured image signal corresponding to the subject which is captured at the single point of view may be generated. The digital signal processing unit 17 processes the captured image signal to generate general two-dimensional captured image data.

As described above, when the digital camera illustrated in FIG. 1 is equipped with the solid-state imaging element 5 with a configuration illustrated in FIG. 2, capturing of a stereoscopic image and capturing of a two-dimensional image may be easily switched. Moreover, since the phase difference AF may be performed using the solid-state imaging element 5 for capturing an image, a high speed AF may be performed without providing a dedicated sensor for the phase difference AF.

In the present embodiment, the configurations of the pixel cells 50 are changed for every type (detected color) in order to prevent degradation of a captured image quality of a stereoscopic image and a two-dimensional image or degradation of precision of the phase difference AF in the solid-state imaging element 5 which may obtain the above-described advantages,. Hereinafter, detailed descriptions will be made.

FIGS. 4A to 4C are schematic cross-sectional views of an R pixel cell 50b, a G pixel cell 50b, and a B pixel cell 50b in the solid-state imaging element 5 illustrated in FIGS. 2 and 3. FIG. 4A is a cross-sectional view of the R pixel cell 50b, FIG. 4B is a cross-sectional view of the G pixel cell 50b, and FIG. 4C is a cross-sectional view of the B pixel cell 50b.

The pixel cell 50a includes a semiconductor substrate 53 such as a silicon substrate, a photoelectric converting unit (PD) 54a provided in the semiconductor substrate 53, an insulating layer 56 formed on the photoelectric converting unit 54a, a color filter 57 formed on the insulating layer 56, and a micro lens 58 formed on the color filter 57.

A light shielding film 55 configured to limit a light incident range of the photoelectric converting unit 54a is formed in the insulating layer 56. An aperture 54 is formed at an upper side (a light entering side) of the photoelectric converting unit 54a in the light shielding film 55 and light condensed by the micro lens 58 is incident on the photoelectric converting unit 54a through the aperture 54.

In the pixel cell 50a, an optical axis of the micro lens 58 does not conform to a center of the aperture 54 and the center of the aperture 54 is off-centered to the left side in the row direction X with respect to the optical axis of the micro lens 58. The off-centered amount of the aperture 54 varies depending on the type of the pixel cell 50a.

Specifically, a relationship among an off-centered amount Or of the aperture 54 of the R pixel cell 50a, an off-centered amount Og of the aperture 54 of the G pixel cell 50a, and an off-centered amount Ob of the aperture 54 of the B pixel cell 50a is set to be Or>Og>Ob.

The off-centered amount Or represents a distance between the position of the optical axis of the micro lens 58 in the R pixel cell 50a and the position of the center of the aperture 54, in the row direction X.

The off-centered amount Og represents a distance between the position of the optical axis of the micro lens 58 in the G pixel cell 50a and the position of the center of the aperture 54, in the row direction X.

The off-centered amount Ob represents a distance between the position of the optical axis of the micro lens 58 in the B pixel cell 50a and the position of the center of the aperture 54, in the row direction X.

FIGS. 5A to 5C are plan views for each pixel cell 50a illustrated in FIGS. 4A to 4C, as viewed from the micro lens 58 side. In FIGS. 5A to 5C, the micro lens and the color filter are not illustrated.

FIG. 5A illustrates a plan view of the R pixel cell 50a illustrated in FIG. 4A, FIG. 5B illustrates a plan view of the G pixel cell 50a illustrated in FIG. 4B, and FIG. 5C illustrates a plan view of the B pixel cell 50a illustrated in FIG. 4C.

In examples of FIGS. 4A to 5C, the positions of left end portions of the apertures 54 of the light shielding films 55 are set to be the same in respective pixel cells 50a, and the positions of the right end portions in the row direction X are set such that the right end of a pixel cell 50a detecting light of a longer wavelength region is spaced farther away from the optical center of the pixel cell 50a (the position of the optical axis of the micro lens 58) the pixel cells 50a, thereby realizing the relationship of Or>Og>Ob.

As described above, the longer the wavelength detected by a pixel cell 50a, the larger the spot diameter of the luminous fluxes incident on the pixel cell 50a. Thus, a pupil division performance (a phase difference separation amount) of a pixel cell 50a is degraded when the wavelength detected by the pixel cell 50a is longer. Therefore, when the relationship of Or>Og>Ob is satisfied as illustrated in FIGS. 4A to 5C, each pixel cell 50a may be provided with the pupil division performance.

Therefore, the phase difference AF may be precisely performed without causing variation in precision for obtaining phase difference information (a deviated amount of images which respectively correspond to a pair of luminous fluxes which pass through different pupil areas of the photographing optical system 1) depending on the types of the pixel cells 50a. Moreover, unnatural coloration does not occur in stereoscopic image data or two-dimensional captured image data so that the imaging quality can be enhanced.

Since, as to the pixel cells 50b, the configurations illustrated in FIGS. 4A to 5C are merely inversed between right and left, the description thereof will be omitted.

In the foregoing description, in the pixel cells 50, the sizes of the apertures K of the light shielding films 55 are changed depending on the detected wavelengths thereof, respectively. However, since the pupil division performance is determined by a distance from the optical axis of the micro lens 58 to the center of the aperture K, the sizes of the apertures K may be set to be the same in all the pixel cells 50.

For example, as illustrated in FIGS. 6A to 6C, the pixel cells 50 may be configured such that the apertures 54 in all the pixel cells 50 have the same shape and the center positions of the apertures 54 vary depending on the types of the pixel cells 50. When the apertures K have the same shape in all the pixel cells 50 as described above, manufacturing is facilitated, which results in cost reduction.

Even though a relationship has been set to be Or>Og>Ob in the foregoing description, the phase difference AF precision or imaging quality may be improved only when at least a relationship of Or>Ob is satisfied since the difference between the sizes of the spot lights are most significant between the R pixel cells 50a and 50b and the B pixel cells 50a and 50b.

For example, the relationship may be set to be Or=Og>Ob as illustrated in FIGS. 7A to 7C, or the relationship may be Or>Og=Ob as illustrated in FIGS. 8A to 8C.

FIG. 9 is a schematic plan view of a solid-state imaging element 5a which is a modified embodiment of the solid-state imaging element 5 illustrated in FIG. 2.

The solid-state imaging element 5a has a so-called honeycomb arrangement in which the pixel cells 50a and the pixel cells 50b of FIG. 2 are rotated by 45 degrees and odd-numbered pixel cell rows are shifted in the row direction X by ½ of the arrangement pitch of the pixel cells 50 in the row direction X.

Figure 10:
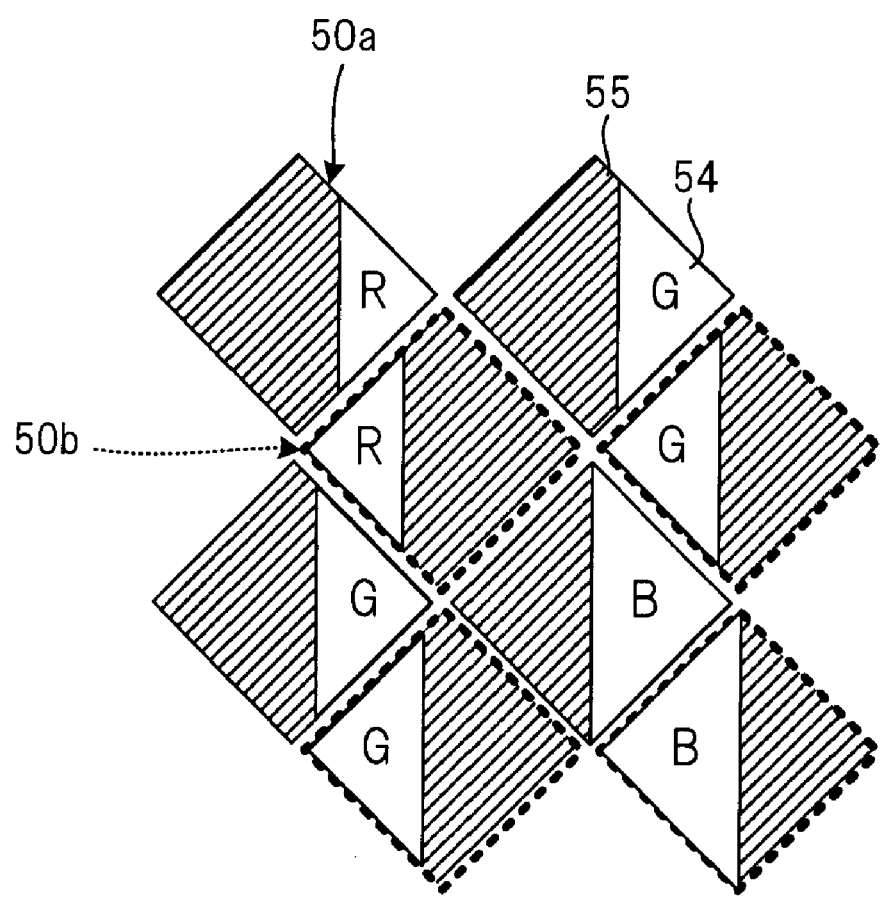
FIG. 10 is an enlarged view of a region H of the solid-state imaging element 5a illustrated in FIG. 9.

FIG. 10 is an enlarged view of a region H of the solid-state imaging element 5a illustrated in FIG. 9.

As illustrated in FIG. 10, a separated distance from a center position of the aperture 54 of the light shielding film 55 in each pixel cell 50 which is an optical axis center of the each pixel cell 50 is as follows: R pixel cells 50a and 50b >G pixel cells 50a and 50b >B pixel cells 50a and 50b.

With this pixel cell arrangement, the same effect as that of the solid-state imaging element 5 may also be obtained.

Figure 11:
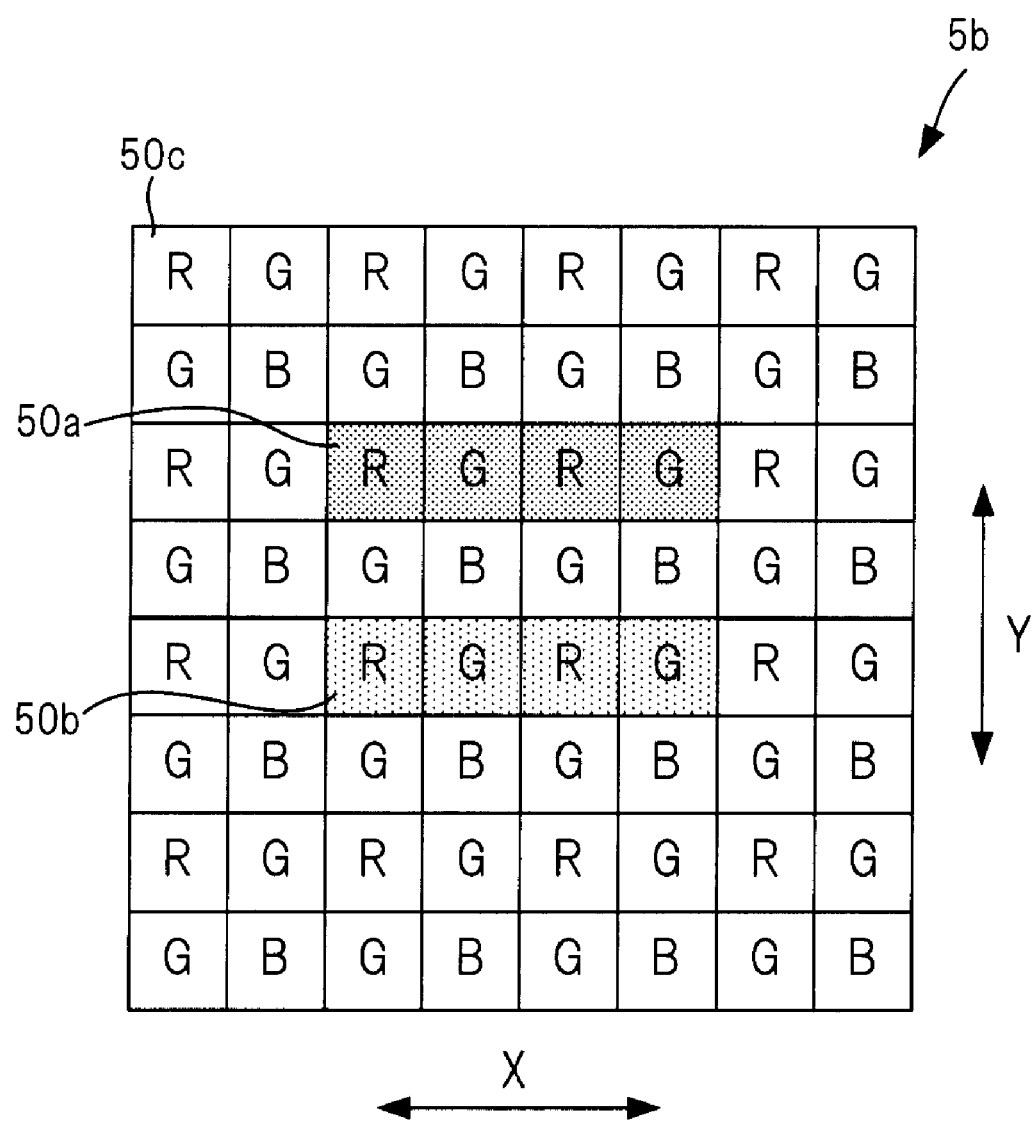
FIG. 11 is a plan view illustrating a configuration of a solid-state imaging element 5b which is a modified embodiment of the solid-state imaging element 5 illustrated in FIG. 2.

FIG. 11 is a plan view illustrating a configuration of a solid-state imaging element 5b which is a modified embodiment of the solid-state imaging element 5 illustrated in FIG. 2.

The solid-state imaging elements 5 and 5a do not have a pixel cell which receives both of a pair of luminous fluxes which pass through different pupil regions of the photographing optical system 1 (a pixel cell in which a pupil is not divided). To the contrary, a solid-state imaging element 5b includes pixel cells 50c in which pupils are not divided, and the pixel cells 50a and 50b in which the pupils are divided as described above.

In the solid-state imaging element 5b, some of the pixel cells 50c which are arranged two-dimensionally (in a square lattice type in an example of FIG. 11) are formed as pixel cells 50a and 50b. In FIG. 11, some of the pixel cells 50c which detect R light component and some of the pixel cells 50c which detect G light component are substituted by the pixel cells 50a and 50b.

In addition, a configuration in which some of the pixel cells 50c which detect the R light component and some of the pixel cells 50c which detect the B light component are substituted by the pixel cells 50a and 50b, a configuration in which some of the pixel cells 50c which detect the G light component and some of the pixel cells 50c which detect the B light component are substituted by the pixel cells 50a and 50b, or a configuration in which some of the pixel cells 50c which detect the R light component, some of the pixel cells 50c which detect the G light component, and some of the pixel cells 50c which detect the B light component are substituted by the pixel cells 50a and 50b may be employed.

When the solid-state imaging element 5b includes, as pupil-divided pixels, only the pixel cells 50a and 50b which detect the R light component and the cells 50a and 50b which detect the G light component, the above-described relationship of Or and Og may be set to be Or>Og.

When the solid-state imaging element 5b includes, as the pupil-divided pixels, only the pixel cells 50a and 50b which detect the R light component and the pixel cells 50a and 50b which detect the B light component, the above-described relationship of Or and Ob may be set to be Or>Ob.

When the solid-state imaging element 5b includes, as the pupil-divided pixels, only the pixel cells 50a and 50b which detect the G light component and the pixel cells 50a and 50b which detect the B light component, the above-described relationship of Og and Ob may be set to be Og>Ob.

When the solid-state imaging element 5b includes, as the pupil-divided pixels, only the pixel cells 50a and 50b which detect the R light component, the pixel cells 50a and 50b which detect the G light component, and the pixel cells 50a and 50b which detect the B light component, the above-described relationship of Or, Og, and Ob may be set to be any one of Or>Og>Ob, Or=Og>Ob, and Or>Og=Ob.

In a digital camera equipped with the solid-state imaging element 5b, the system control unit 11 performs the phase difference AF using signals obtained by the pixel cells 50a and 50b. Specifically, the system control unit 11 performs an AF control based on a phase difference between an image signal obtained by the pixel cells 50a and an image signal obtained by the pixel cells 50b.

As described above, even when some of the pixel cells 50c are substituted with the pupil-divided pixel cells 50a and 50b in a solid-state imaging element in which ordinary pixel cells 50c which are not pupil-divided are two-dimensionally arranged, it is possible to improve the phase difference AF precision and the quality of a captured image when a large/small relationship among Or, Og, and Ob is set as described above.

Furthermore, when the solid-state imaging element 5b includes, as the pupil-divided pixels, the pixel cells 50a and 50b which detect the R light component, the pixel cells 50a and 50b which detect the G light component, and the pixel cells 50a and 50b which detect the B light component and when these three types of pixel cells 50a and 50b are arranged therein from end to end, it becomes possible to cope with both 3D photography and 2D photography.

For example, at the time of 3D photography, stereoscopic image data is generated using captured image signals obtained by the three types of the pixel cells 50a and 50b, and at the time of 2D photography, captured image data is generated using captured image signals obtained by the pixel cells 50c. In addition, at the time of 2D photography, the signals corresponding to the pixel cells 50a and 50b may be interpolated using the signals obtained by the pixel cells 50c.

Figure 12:
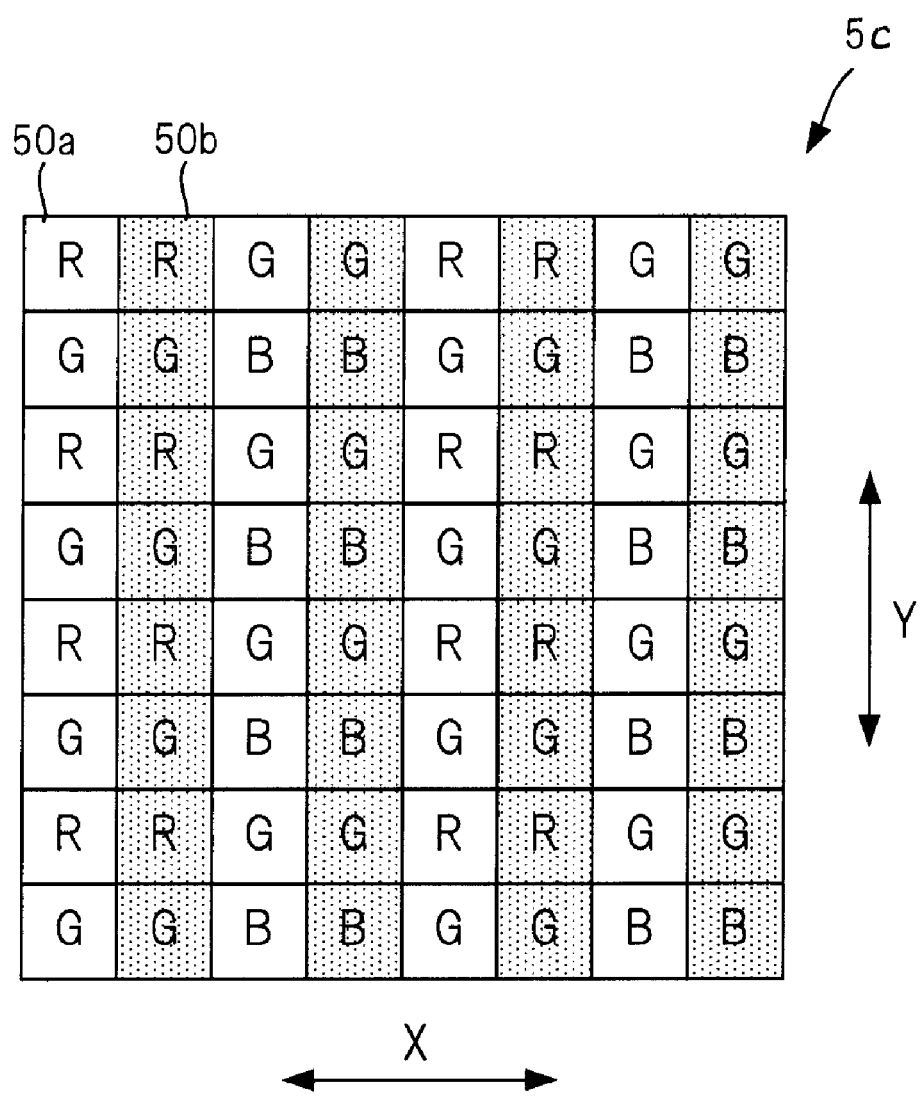
FIG. 12 is a schematic plan view of a solid-state imaging element 5c which is a modified embodiment of the solid-state imaging element 5 illustrated in FIG. 2.

FIG. 12 is a plan view illustrating a configuration of a solid-state imaging element 5c which is a modified embodiment of the solid-state imaging element 5 illustrated in FIG. 2.

The solid-state imaging element 5c is the same as the solid-state imaging element 5 in that pixel cells 50a and pixel cells 50b are arranged two-dimensionally. The solid-state imaging element 5c has a configuration in which the pixel cells 50a are arranged in a Bayer pattern in odd numbered columns and, in relation to each pixel 50a, a pixel cell 50a which detects light having the same color as that detected by the pixel cell 50a is arranged next to the pixel cell 50a in the row direction X. In the solid-state imaging element 5c, pixel cell pairs are configured by the same types of pixel cells 50a and pixel cells 50b which are adjacent to each other in the row direction X.

Figure 13A:
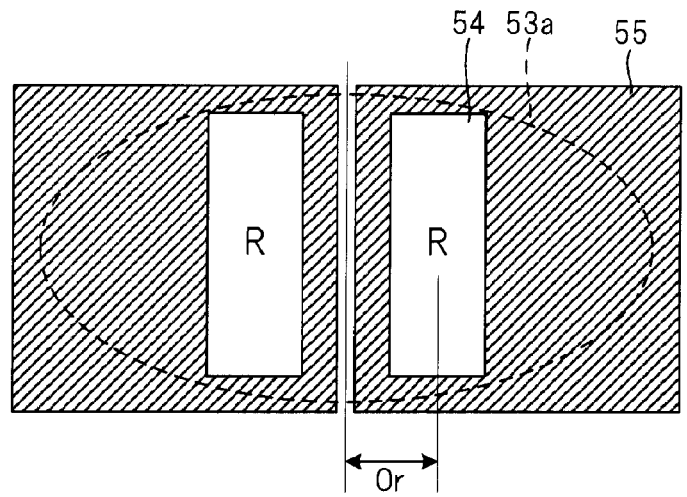
FIGS. 13A to 13C are views for illustrating in detail a pixel cell pair which detects an R light component, a pixel cell pair which detects a G light component, and a pixel cell pair which detects a B light component in the solid-state imaging element 5c illustrated in FIG. 12.
Figure 13B:
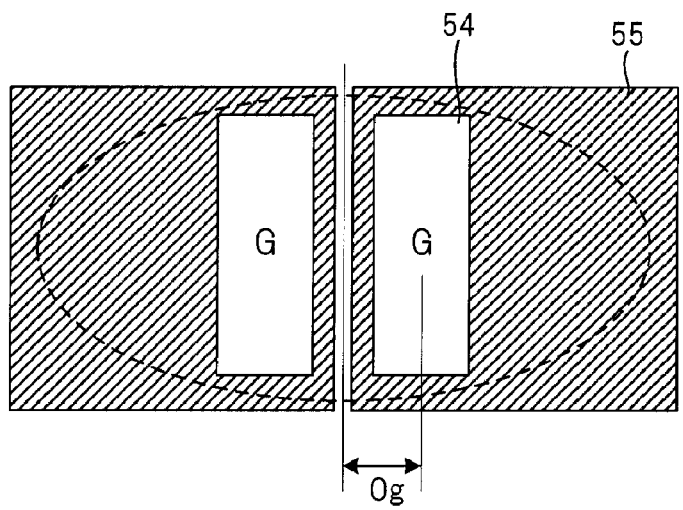
Figure 13C:
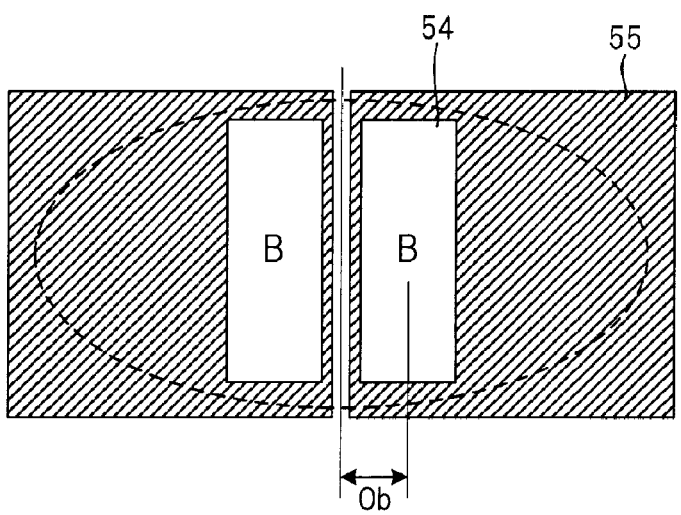

FIGS. 13A to 13C are views for illustrating in detail a pixel cell pair which detects an R light component, a pixel cell pair which detects a G light component, and a pixel cell pair which detects a B light component in the solid-state imaging element 5c illustrated in FIG. 12.

FIG. 13A illustrates a configuration of a pixel cell pair which detects an R light component in the solid-state imaging element 5c. FIG. 13B illustrates a configuration of a pixel cell pair which detects a G light component in the solid-state imaging element 5c. FIG. 13C illustrates a configuration of a pixel cell pair which detects a B light component in the solid-state imaging element 5c.

As illustrated in FIGS. 13A to 13C, in the solid-state imaging element 5c, one micro lens 53a is provided for a pixel cell pair. The micro lens 53a has an oval shape which is provided over two pixel cells 50 which configure a pixel cell pair.

Also in the solid-state imaging element 5c, the distances between the optical axes of the micro lenses 53a and the centers of the apertures 54 of individual pixel cells 50 corresponding to the micro lenses 53a are set to be Or, Og, and Ob, respectively, and have the relationships as described above.

Even with a configuration in which one micro lens is provided for each pixel cell pair, the same effect as the solid-state imaging element 5 may be obtained.

Next, descriptions will be made on a configuration of a smart phone as an imaging apparatus.

Figure 14:
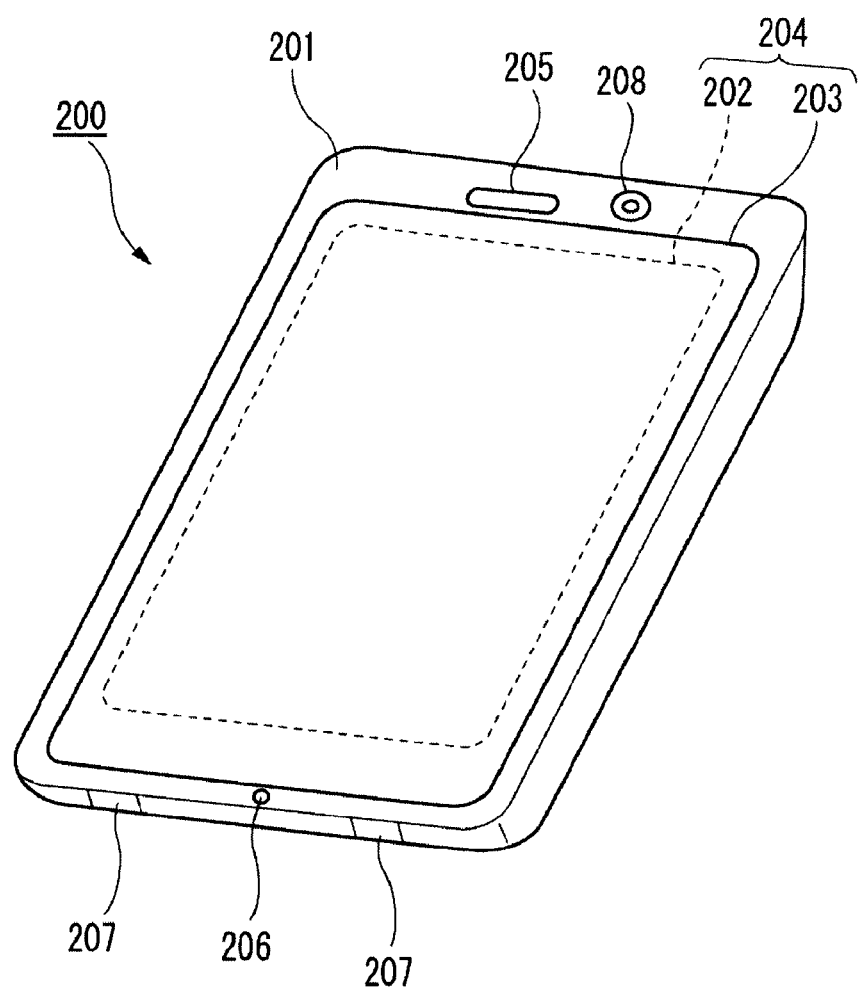
FIG. 14 is a view illustrating a smart phone as an imaging apparatus.

FIG. 14 illustrates an outer appearance of a smart phone 200 which is an embodiment of the imaging apparatus of the present invention. The smart phone 200 illustrated in FIG. 14 includes a flat panel type case 201 and is provided, on one surface of the case 201, with a display input unit 204 in which a display panel 202 as a display unit and an operating panel 203 as an input unit are integrated. In addition, the case 201 includes a speaker 205, a microphone 206, an operating unit 207, and a camera 208. However, the configuration of the case 201 is not limited thereto. For example, a configuration in which the display unit and the input unit are independent from each other may be employed or a configuration having a folding structure or a slide mechanism may be employed.

Figure 15:
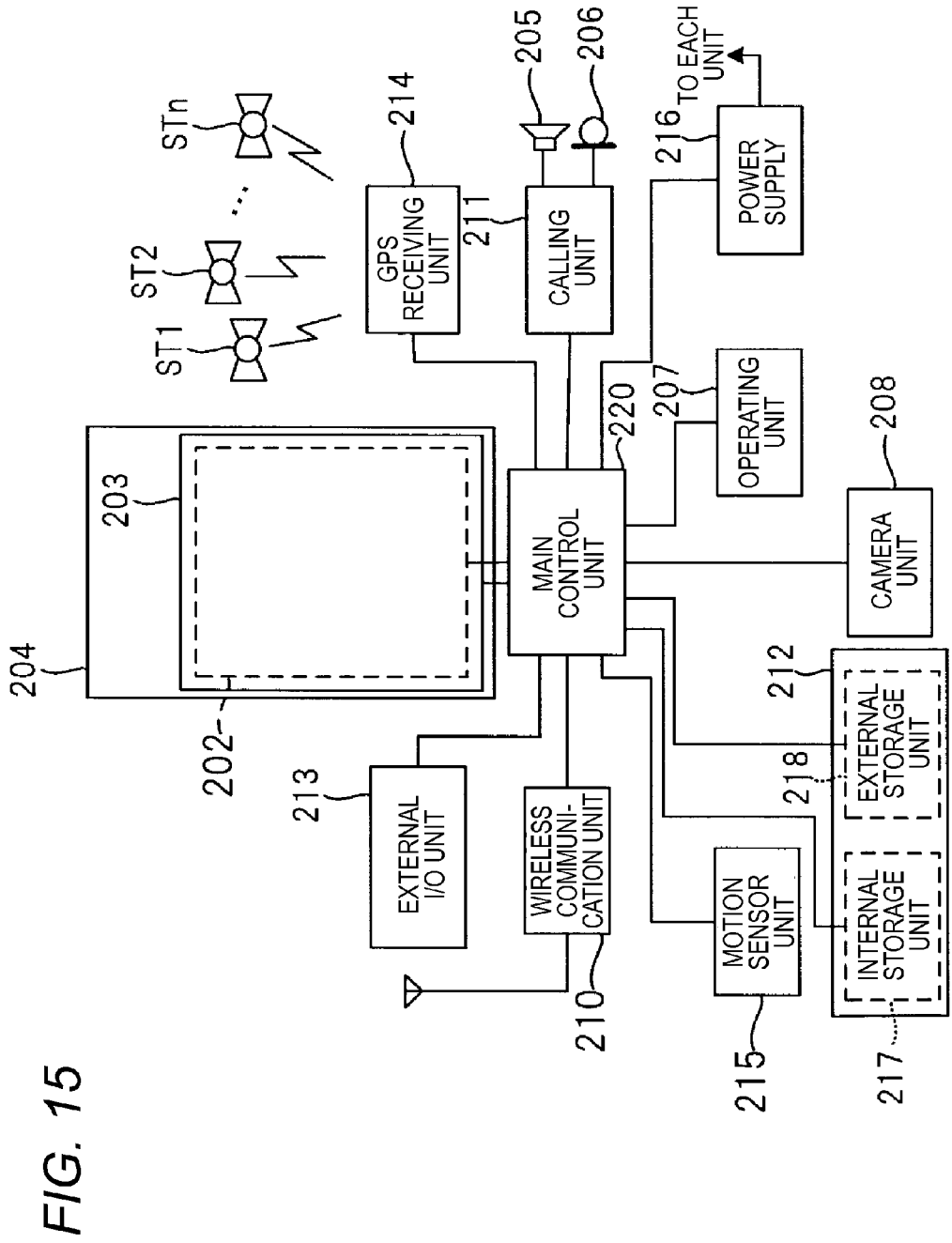
FIG. 15 is an internal block diagram of the smart phone of FIG. 14.

FIG. 15 is a block diagram illustrating a configuration of the smart phone 200 illustrated in FIG. 14. As illustrated in FIG. 14, as main components, the smart phone includes a wireless communication unit 210, a display input unit 204, a calling unit 211, an operating unit 207, a camera 208, a storage unit 212, an external input/output unit 213, a global positioning system (GPS) receiving unit 214, a motion sensor unit 215, a power supply 216, and a main control unit 220. As main functions, the smart phone 200 is provided with a wireless communication function which performs mobile wireless communication through a base station device BS which is not illustrated and a mobile communication network NW which is also not illustrated.

The wireless communication unit 210 performs wireless communication with the base station device BS which is accommodated in the mobile communication network NW in accordance with an instruction of the main control unit 220. Using the wireless communication, the wireless communication unit 210 transmits/receives various file data such as voice data and image data, or electronic mail data, or receives web data, streaming data or the like.

The display input unit 204 is provided with a display panel 202 and an operating panel 203 as a so-called touch panel which displays an image (a still image or a moving picture) or text information under the control of the main control unit 220 so as to visually transmit information to a user, and detects the user's operation on displayed information.

The display panel 202 uses a liquid crystal display (LCD), an organic electro-luminescence display (OLED), or the like, as a display device.

The operating panel 203 is a device which is disposed to allow an image displayed on a display surface of the display panel 202 to be visually recognized and detects one or a plurality of coordinates which can be operated by the user's finger or a stylus. When the device is operated by the user's fingers or the stylus, a detection signal generated based on the operation is output to the main control unit 220. Subsequently, the main control unit 220 detects an operating position (coordinate) on the display panel 202, based on the received detection signal.

As illustrated in FIG. 14, although the display panel 202 and the operating panel 203 of the smart phone 200 exemplified as an embodiment of the imaging apparatus of the present invention are integrated with each other to constitute the display input unit 204, the operation panel 203 is disposed to completely cover the display panel 202.

When such an arrangement is employed, the operating panel 203 may be provided with a function of detecting the user's operation on a region other than the display panel 202. In other words, the operating panel 203 may include a detection region (hereinafter, referred to as a "display region") on an overlapping portion which overlaps the display panel 202 and a detection region (hereinafter, referred to as a "non-display region") on an outer peripheral portion which does not overlap the display panel 202.

Although the size of the display region and the size of the display panel 202 may completely coincide with each other, both does not necessarily coincide with each other. In addition, the operating panel 203 may include two sensitive regions of an outer peripheral portion and an inner portion other than the outer peripheral portion. A width of the outer peripheral portion is appropriately designed in accordance with the size of the case 201. As a position detecting system employed in the operating panel 203, a matrix switch system, a resistive layer system, a surface elastic wave system, an infrared system, an electromagnetic induction system, or an electrostatic capacitive system may be exemplified, and any system may be employed.

The calling unit 211 includes the speaker 205 and the microphone 206 in which the calling unit 211 converts the user's voice input through the microphone 206 into voice data to be processed by the main control unit 220 and outputs the converted voice data to the main control unit 220, or decodes voice data received by the wireless communication unit 210 or the external input/output unit 213 and outputs the decoded voice data from the speaker 205. Furthermore, as illustrated in FIG. 14, for example, the speaker 205 may be mounted on the same surface as the surface provided with the display input unit 204 and the microphone 206 may be mounted on a side surface of the case 201.

The operating unit 207 is a hardware key which uses a key switch and receives an instruction from the user. For example, as illustrated in FIG. 14, the operating unit 207 is a push button type switch which is mounted on a side surface of the case 201 of the smart phone 200 and turned on when it is pressed by a finger and turned off by restoring force of a spring when the finger is removed.

The storage unit 212 stores a control program or control data of the main control unit 220, application software, address data to which names, phone numbers, or the like of communication counterparts are correlated, transmitted/received electronic mail data, web data downloaded by web browsing or downloaded content data, and temporally stored streaming data. In addition, the storage unit 212 is configured by an internal storage unit 217 which is mounted in the smart phone and an external storage unit 218 which includes a detachable external memory slot. Furthermore, the internal storage unit 217 and the external storage unit 218 which configure the storage unit 212 may be implemented by using a storage medium such as a flash memory type, a hard disk type, a multimedia card micro type, a card type memory (e.g., MicroSD (registered trademark) memory), a random access memory (RAM), or a read only memory (ROM).

The external input/output unit 213 functions as an interface with all external devices connected to the smart phone 200 and are configured to be directly or indirectly connected to any other external device by communication (e.g., universal serial bus (USB) or IEEE1394) or a network (e.g., Internet, wireless LAN, Bluetooth (registered trademark), a radio frequency identification (RFID), an infrared data association (IrDA (registered trademark)), ultra wideband (UWD) (registered trademark), or a zigbee (registered trademark).

As external devices connected to the smart phone 200, a wired/wireless head set, a wired/wireless external charger, a wired/wireless data port, a memory card or a SIM (Subscriber Identity Module) card/UIM (User Identity Module) connected through a card socket, an external audio/video device connected through an audio/video input/output (I/O) terminal, a wirelessly connected external audio/video device, a wiredly/wirelessly connected smart phone, a wiredly/wirelessly connected personal computer, a wiredly/wirelessly connected PDA, a wiredly/wirelessly connected personal computer, or an earphone may be exemplified. The external input/output unit 213 transmits data received from such external devices to individual components in the smart phone 200 and may also allow the data in the smart phone 200 to be transmitted to an external device.

The GPS receiving unit 214 receives a GPS signal transmitted from GPS satellites ST1 to ST*n* according to an instruction from the main control unit 220 and performs a position measurement operation based on the received GPS signals to detect positional information including a latitude, a longitude, and a height of the smart phone 200. When the GPS receiving unit 214 may obtain the positional information from the wireless communication unit 210 or the external input/output unit 213 (e.g., the wireless LAN), the GPS receiving unit 214 may also detect a position using that positional information.

The motion sensor 215 includes, for example, a three-axis acceleration sensor and detects a physical movement of the smart phone 200 according to an instruction of the main control unit 220. When the physical movement of the smart phone 200 is detected, the movement direction or acceleration of the smart phone 200 is detected. The detected result is output to the main control unit 220.

A power supply unit 216 supplies a power accumulated in a battery (not illustrated) to individual units of the smart phone 200 according to an instruction of the main control unit 220.

The main control unit 220 includes a microprocessor and operates according to a control program or control data stored in the storage unit 212 and collectively controls individual units of the smart phone 200. Furthermore, the main control unit 220 is provided with a mobile communication control function and an application processing function to control individual units of a communication system in order to perform voice communication or data communication through the wireless communication unit 210.

The application processing function is implemented when the main control unit 220 is operated according to the application software stored in the storage unit 212. The application processing function includes, for example, an infrared communication function which performs data communication with counterpart device by controlling the external input/output unit 213, an electronic mail function which transmits/receives an electronic mail, or a web browsing function which browses a web page.

Also, the main control unit 220 is provided with an image processing function which displays an image on the display input unit 204 based on the image data (still image or moving picture data) such as received data or downloaded streaming data. The image processing function refers to a function of decoding the image data and performing an image processing on the decoded result to display the image on the display input unit 204, by the main control unit 220.

Furthermore, the main control unit 220 executes a display control of the display panel 202 and a operation detection control which detects the user's operation through the operating unit 207 and the operating panel 203. By executing the display control, the main control unit 220 displays an icon to activate an application software or a software key such as a scroll bar (for making an instruction for continuous display in a connected state), or displays a window for preparing an electronic mail. Here, the scroll bar refers to a software key for receiving an instruction to move a displayed portion of an image with respect to a large image which cannot enter into the display region of the display panel 202.

In addition, when the operation detection control is executed, the main control unit 220 detects the user's operation through the operating unit 207, receives the operation on the icon or an input of a character string on an input section of the window through the operating panel 203, or receives a scroll request of a displayed image through the scroll bar.

Furthermore, by executing the operation detection control, the main control unit 220 determines whether the operating position of the operating panel 203 is an overlapping portion (display region) which overlaps with the display panel 202 or an outer peripheral portion (non-display region) which does not overlap with the display panel 202 other than the overlapping portion, and is provided with a touch panel control function that controls a sensitive region of the operating panel 203 or a display position of the software key.

Moreover, the main control unit 220 detects a gesture operation with respect to the operating panel 203 and executes a predetermined function according to the detected the gesture operation. The gesture operation refers to an operation which draws a trace using a finger, designates a plurality of positions simultaneously, or a combination thereof to draw a trace for at least one of the plurality of positions, rather than a simple touch operation of the related art.

The camera 208 includes a configuration other than the external memory control unit 20, the recording medium 21, the display control unit 22, the display unit 23, and the operating unit 14 in the digital camera illustrated in FIG. 1. Captured image data generated by the camera 208 may be stored in the storage unit 212, or output through the external input/output unit 213 or the wireless communication unit 210. As illustrated in FIG. 14, although the camera 208 is mounted on the same surface as the display input unit 204 in the smart phone 200, the mounting position of the camera 208 is not limited thereto and the camera 208 may be mounted on a rear surface of the display input unit 204.

In addition, the camera 208 may be used for various functions of the smart phone 200. For example, although an image obtained by the camera 208 may be displayed on the display panel 202, the image of the camera 208 may be used as one of operation inputs of the operating panel 203. In addition, when the GPS receiving unit 214 detects the position, the position may be detected with reference to the image from the camera 208. Also, although an optical axis direction of the camera 208 of the smart phone 200 may be determined with reference to the image from the camera 208, either without using the 3-axis acceleration sensor or using the 3-axis acceleration sensor, a current usage environment may also be determined. Of course, the image from the camera 208 can be used in the application software.

In addition, positional information obtained by the GPS receiving unit 214, voice information obtained by the microphone 206 (which may be text information obtained by performing a voice-text conversion by the main control unit or the like), or posture information obtained by the motion sensor 215 may be added to the image data or a still image or a moving picture to be stored in the storage unit 212 or may be be output through the external input/output unit 213 or the wireless communication unit 210.

Also in the smart phone 200 with the above-described configuration, when the solid-state imaging elements 5, 5a, and 5b are used as imaging elements of the camera 208, high precision phase difference AF and high quality photography may be enabled.

As described above, the following matters are disclosed herein.

It is disclosed an imaging element capable of outputting a pair of image signals which correspond to a pair of luminous fluxes which pass through different pupil areas of a photographing optical system, respectively, the imaging element including: pixel cells including photoelectric converting units, micro lenses provided at light entrance sides of the photoelectric converting units to condense lights onto the photoelectric converting units and light shielding films which is provided between the photoelectric converting units and the micro lenses and has apertures at the light entrance sides of the photoelectric converting units, in which the pixel cells include plural sets of pairs each having a first pixel cell and a second pixel cell, center positions of apertures of light shielding films of the first pixel cell and the second pixel cell being off-centered in opposite directions with respect to an optical axis of the micro lens, the first pixel cell and the second pixel cell are divided into plural types which detect lights of different wavelength bands, respectively, and among the pixel cells, a distance from an optical axis of the micro lens to the center of the aperture of the micro lens for each of the first pixel cell and the second pixel cell in which a wavelength band of the light detected by the photoelectric converting unit becomes the longest wavelength side is longer than the distance for each of the first pixel cell and the second pixel cell in which a wavelength band of the light becomes the shortest wavelength side.

It is disclosed the imaging element, in which the plural types of pixel cells include at least two types of a pixel cell which detects a red light component, a pixel cell which detects a blue light component and a pixel cell which detects a green light component.

It is disclosed the imaging element, in which the imaging element is set to be (the distance in the pixel cell which detects the red light component)>(the distance in the pixel cell which detects the green light component)>(the distance in the pixel cell which detects the blue light component).

It is disclosed the imaging element, in which the distances for two of the pixel cell which detects the red light component, the pixel cell which detects the blue light component and the pixel cell which detects the green light component are set to be the same.

It is disclosed the imaging element, in which the distances for the pixel cell which detects the red light component and the pixel cell which detects the green light component are set to be the same, and the distance for the pixel cell which detects the blue light component is set to be shorter than the distances for the pixel cell which detects the red light component and the pixel cell which detects the green light component.

It is disclosed the imaging element, in which the distances for the pixel cell which detects the blue light component and the pixel cell which detects the green light component are set to be the same, and the distance for the pixel cell which detects the red light component is set to be longer than the distances for the pixel cell which detects the blue light component and the pixel cell which detects the green light component.

It is disclosed the imaging element, in which the apertures of the light shielding films in at least four pixel cells have the same shape.

It is disclosed the imaging element, in which each of the pairs is configured by the first pixel cell and the second pixel cell which is disposed to be adjacent to the first pixel cell and detects light in the same wavelength band as the first pixel cell, and the pairs are arranged two-dimensionally.

It is disclosed an imaging apparatus including the imaging element.

It is disclosed the imaging apparatus, further including: a stereoscopic image generating unit which generates stereoscopic image data using signals obtained from the plural sets of pairs.

It is disclosed the imaging apparatus, further including: a focus adjusting unit which adjusts a focus using signals which is obtained from the plural sets of pairs.

INDUSTRIAL APPLICABILITY

The imaging element and the imaging apparatus according to the present invention precisely detect a deviated amount of images which respectively correspond to a pair of luminous fluxes which have passed through different pupil areas of an photographing optical system such that precision of the phase difference AF may be improved and unnatural coloration on the captured image may be prevented, thereby improving an imaging quality. Therefore, the imaging element and the imaging apparatus may be usefully used for various information devices such as a digital camera and a smart phone.

This application is based on Japanese Patent Application No. 2012-74309 filed on May 28, 2012 and the entire contents of which are incorporated herein by reference.

REFERENCE SIGNS LIST

5: Solid-state imaging element
50a, 50b: Pixel cell
54: Aperture of light shielding film
Og: Off-centered amount of aperture of light shielding film

The invention claimed is:

1. An imaging element capable of outputting a pair of image signals which correspond to a pair of luminous fluxes which pass through different pupil areas of a photographing optical system, respectively, the imaging element comprising:

pixel cells comprising photoelectric converting units, micro lenses provided at light entrance sides of the photoelectric converting units to condense lights onto the photoelectric converting units and light shielding films which is provided between the photoelectric converting units and the micro lenses and has apertures at the light entrance sides of the photoelectric converting units, wherein the pixel cells include plural sets of pairs each having a first pixel cell and a second pixel cell, center positions of apertures of light shielding films of the first pixel cell and the second pixel cell being off-centered in opposite directions with respect to an optical axis of the micro lens, the first pixel cell and the second pixel cell are divided into plural types which detect lights of different wavelength bands, respectively, and among the pixel cells, a distance from an optical axis of the micro lens to the center of the aperture of the micro lens for each of the first pixel cell and the second pixel cell in which a wavelength band of the light detected by the photoelectric converting unit becomes the longest wavelength side is longer than the distance for each of the first pixel cell and the second pixel cell in which a wavelength band of the light becomes the shortest wavelength side.

2. The imaging element of claim 1, wherein the plural types of pixel cells include at least two types of a pixel cell which detects a red light component, a pixel cell which detects a blue light component and a pixel cell which detects a green light component.

3. The imaging element of claim 2, wherein the imaging element is set to be (the distance in the pixel cell which detects the red light component)>(the distance in the pixel cell which detects the green light component)>(the distance in the pixel cell which detects the blue light component).

4. The imaging element of claim 2, wherein the distances for two of the pixel cell which detects the red light component, the pixel cell which detects the blue light component and the pixel cell which detects the green light component are set to be the same.

5. The imaging element of claim 4, wherein the distances for the pixel cell which detects the red light component and the pixel cell which detects the green light component are set to be the same, and the distance for the pixel cell which detects the blue light component is set to be shorter than the distances for the pixel cell which detects the red light component and the pixel cell which detects the green light component.

6. The imaging element of claim 4, wherein the distances for the pixel cell which detects the blue light component and the pixel cell which detects the green light component are set to be the same, and the distance for the pixel cell which detects the red light component is set to be longer than the distances for the pixel cell which detects the blue light component and the pixel cell which detects the green light component.

7. The imaging element of claim 1, wherein the apertures of the light shielding films in at least four pixel cells have the same shape.

8. The imaging element of claim 1, wherein each of the pairs is configured by the first pixel cell and the second pixel cell which is disposed to be adjacent to the first pixel cell and detects light in the same wavelength band as the first pixel cell, and the pairs are arranged two-dimensionally.

9. An imaging apparatus comprising:
the imaging element of claim 1.

10. The imaging apparatus of claim 9, further comprising:
a stereoscopic image generating unit which generates stereoscopic image data using signals obtained from the plural sets of pairs.

11. The imaging apparatus of claim 9, further comprising:
a focus adjusting unit which adjusts a focus using signals which is obtained from the plural sets of pairs.

* * * * *